(12) United States Patent
Gonska et al.

(10) Patent No.: US 9,567,212 B2
(45) Date of Patent: Feb. 14, 2017

(54) MICROMECHANICAL COMPONENT

(71) Applicant: Robert Bosch GmbH, Stuttgart (DE)

(72) Inventors: Julian Gonska, Reutlingen (DE); Jochen Reinmuth, Reutlingen (DE); Kathrin Gutsche, Oberhausen (DE); Jens Frey, Filderstadt (DE); Heribert Weber, Nuertingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 14/061,887

(22) Filed: Oct. 24, 2013

(65) Prior Publication Data
US 2014/0117472 A1 May 1, 2014

(30) Foreign Application Priority Data
Oct. 26, 2012 (DE) .......... 10 2012 219 605

(51) Int. Cl.
H01L 29/84 (2006.01)
H01L 21/00 (2006.01)
B81C 1/00 (2006.01)
B81B 7/02 (2006.01)

(52) U.S. Cl.
CPC ............. *B81C 1/00285* (2013.01); *B81B 7/02* (2013.01); *B81B 2201/0235* (2013.01); *B81B 2201/0242* (2013.01); *B81B 2207/096* (2013.01); *B81C 2203/0118* (2013.01); *B81C 2203/035* (2013.01)

(58) Field of Classification Search
CPC .................................................. B81B 3/0064
USPC ............................................. 257/415; 438/51
See application file for complete search history.

(56) References Cited

U.S. PATENT DOCUMENTS

| 5,335,550 | A | 8/1994 | Satou | |
|---|---|---|---|---|
| 8,286,854 | B2 | 10/2012 | Rettig et al. | |
| 8,763,457 | B2* | 7/2014 | Chen | G01L 19/0092 73/431 |
| 9,156,683 | B2* | 10/2015 | Morris, III | B81B 7/0041 |
| 2004/0045354 | A1* | 3/2004 | Lentner | G01C 19/5712 73/504.04 |
| 2006/0144142 | A1* | 7/2006 | Gogoi | 73/504.02 |
| 2008/0128841 | A1* | 6/2008 | Fujimori et al. | 257/418 |
| 2010/0028618 | A1* | 2/2010 | Gonska et al. | 428/188 |
| 2011/0048129 | A1* | 3/2011 | Yamanaka | B81B 7/02 73/504.12 |
| 2011/0048132 | A1 | 3/2011 | Rettig et al. | |
| 2011/0169125 | A1* | 7/2011 | Reinmuth et al. | 257/506 |
| 2011/0169143 | A1* | 7/2011 | Reinmuth | H01L 23/3178 257/659 |
| 2012/0043627 | A1* | 2/2012 | Lin | B81B 7/02 257/415 |

(Continued)

FOREIGN PATENT DOCUMENTS

CN 101643193 A 2/2010

Primary Examiner — Matthew Landau
Assistant Examiner — Igwe U Anya
(74) Attorney, Agent, or Firm — Norton Rose Fulbright US LLP; Gerard Messina

(57) ABSTRACT

A micromechanical component includes a first space in which a first sensor is situated and a second space in which a second sensor is situated, different pressures prevailing in the first and second spaces, one of the two spaces extending via a third space to a first lattice structure which is situated in an edge region of the component and is essentially hermetically sealed.

12 Claims, 25 Drawing Sheets

(56) References Cited

U.S. PATENT DOCUMENTS

2012/0326248 A1* 12/2012 Daneman et al. ............ 257/415
2013/0001710 A1* 1/2013 Daneman et al. ............ 257/415

* cited by examiner

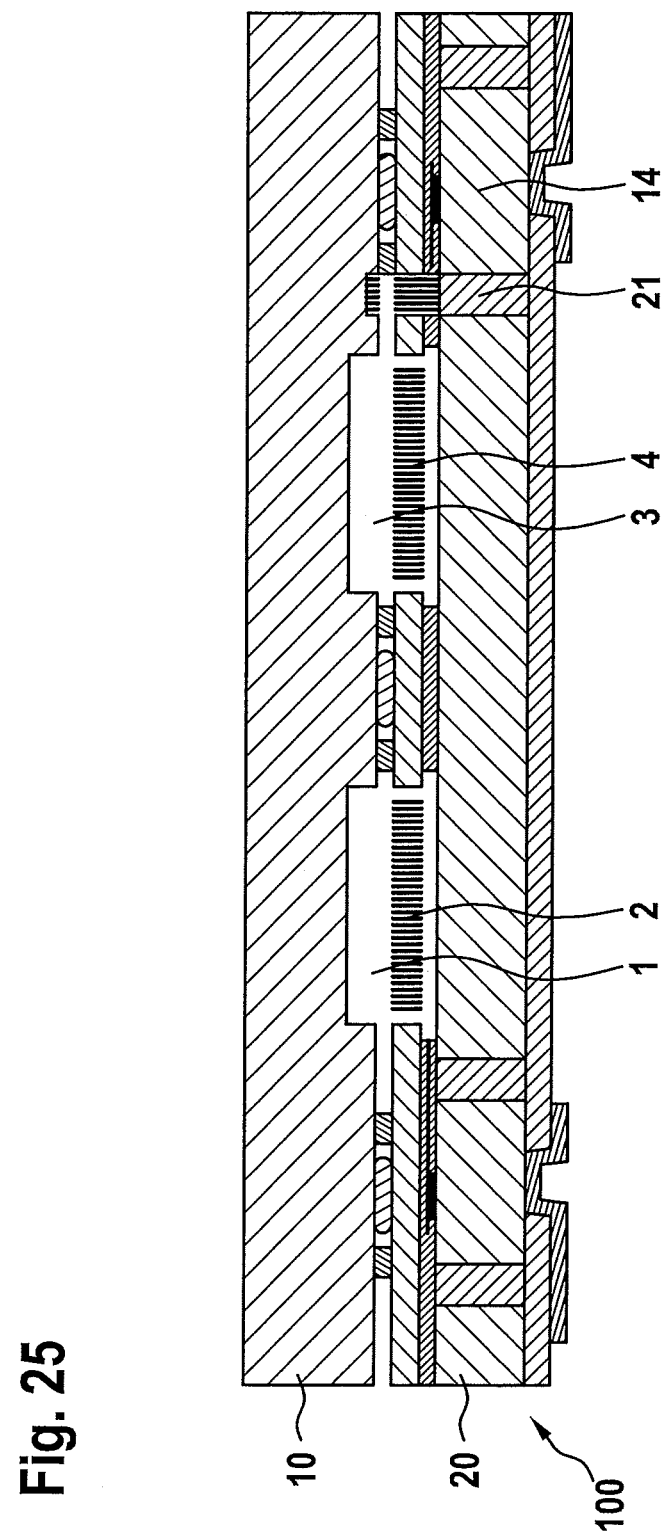

MICROMECHANICAL COMPONENT

CROSS REFERENCE TO RELATED APPLICATION

The present application claims priority to Application No. DE 10 2012 219 605.6, filed in the Federal Republic of Germany on Oct. 26, 2012, which is expressly incorporated herein in its entirety by reference thereto.

FIELD OF INVENTION

The present invention relates to a micromechanical component. The present invention further relates to a method for manufacturing a micromechanical component.

BACKGROUND INFORMATION

It is known that micromechanical acceleration and yaw rate sensors (inertial sensors) are manufactured on a single wafer as part of increasing the functional diversity thereof. If the internal pressure of caverns in which the sensors are situated is identical, considerable worsening of the sensor properties must be expected, e.g., with respect to sensor sensitivity or mechanical robustness of the sensors. It is therefore generally provided that different pressures are provided in the caverns of the acceleration and yaw rate sensors.

In this context methods are known in which a so-called getter is introduced into one of the caverns, which is activated after a capping process and is able to bind, or getter, the residual gas in the hermetically sealed cavern. It is possible in this way to manufacture caverns having different internal pressures in one manufacturing process. However, the described method is demanding in terms of the process technology and very cost-intensive.

German Application No. DE 10 2009 045 385 describes a method for sealing at least one trench of a micromechanical or electrical component, including the following steps: applying a lattice to the component over the trench to be formed, forming the trench beneath the lattice, and sealing the openings of the lattice over the trench by depositing a layer onto the lattice.

SUMMARY

It is an object of the present invention to provide a micromechanical component for sensors which is easier to produce.

According to a first exemplary aspect, the object is achieved by a micromechanical component having a first space in which a first sensor is situated and a second space in which a second sensor is situated, the pressures prevailing in the first and second spaces being different. The micromechanical component is characterized in that one of the two spaces extends over a third space to a lattice structure which is situated in an edge region of the component and is essentially hermetically sealed.

According to a second exemplary aspect, the object is achieved by a method for manufacturing a micromechanical component, including the following steps:

providing two spaces in a wafer layer composition;

forming a third space having a connecting region to one of the two spaces, the third space being guided to a lattice structure in an edge region of the component; and sealing the lattice structure with a sealing layer, the pressure in one of the spaces being adjusted as a function of a deposition process of the sealing layer.

The present invention in this way provides a micromechanical component, which has different internal pressures in two caverns and as a result has very good operating conditions for inertial sensors, which are situated in a respective cavern. It is possible with the aid of the lattice structure to form a ventilation channel to one of the two spaces using etching processes, so that a pressure which is different from the two caverns may be provided via the ventilation channel.

One preferred exemplary embodiment of the micromechanical component is characterized in that the lattice structure is sealed completely, and an upper surface of the component is sealed at least partially, with a sealing layer. This advantageously prevents air, moisture, dust, particles, etc. from penetrating into the cavern having the sensor structure. This advantageously supports trouble-free use of the sensor.

One preferred exemplary embodiment of the micromechanical component is characterized in that the sealing layer may be deposited with the aid of different deposition processes. In this way, a required internal pressure in the cavern, and as a result respective optimal operating pressures for the sensors, may advantageously be adjusted by selecting the deposition process for the sealing layer.

One preferred exemplary embodiment of the micromechanical component according to the present invention is characterized in that a connecting region between one of the two spaces and the third space is constricted. This advantageously allows a penetration of external particles into functional sensor structures to be suppressed as far as possible, whereby trouble-free operation of the sensors is supported.

One preferred exemplary embodiment of the micromechanical component according to the present invention provides for the constriction to be formed with the aid of bonding materials of a sensor wafer and a cap wafer of the component. As a result, advantageously existing materials in the manufacturing process of the sensor and the cap wafer are used to form the constriction in the cavern interior.

One preferred exemplary embodiment of the micromechanical component according to the present invention provides for the connecting region to be designed as an essentially lateral lattice structure or as a channel structure. In this way, advantageously different options for forming the connecting region in one of the caverns are provided.

According to one exemplary refinement of the micromechanical component according to the present invention, a passivation layer is situated on at least a portion of an upper surface of the sealing layer. This advantageously increases the mechanical stability of the sealing layer in the region of free-standing diaphragm structures and offers further protection from penetrating moisture into the layer system located beneath, which is, for example, made of silicon oxide layers. As a result, the operating properties of the sensor may be largely ensured in the long term.

According to one advantageous exemplary refinement of the micromechanical component according to the present invention, an electrically conducting connection is formed to at least one of the sensors, the electrically conducting connection being at least partially delimited by an insulating trench which is producible with the aid of the lattice structure, the insulating trench essentially forming the third space. In this way, advantageously both electrical vias in the form of through silicon vias (TSVs) and ventilation structures to sensor regions may be produced in one manufacturing process of the micromechanical component with the aid of the lattice structure. In this way, the insulating trench region may advantageously be used for ventilation of the cavern region of one of the sensors.

One advantageous exemplary refinement of the micromechanical component according to the present invention is characterized in that metal is situated over the lattice structure designed to be electrically insulating. In this way, protection from moisture may advantageously be improved even further and the trapped pressure in the interior of one of the caverns may advantageously be kept stable.

One preferred exemplary embodiment of the micromechanical component is characterized in that the third space is formed essentially in the cap wafer or essentially in the sensor wafer of the micromechanical component. This advantageously offers the option of forming the ventilation access either from the side of the cap wafer or from the side of the sensor wafer.

One advantageous exemplary refinement of the method according to the present invention provides for a connecting region between the third space and one of the two spaces to be designed in a constricted manner. In this way, advantageously disruptive particles may largely be prevented from penetrating into functional sensor structures via an advantageous configuration of the constriction.

One preferred exemplary embodiment of the method according to the present invention provides for the connecting region to be designed as an essentially lateral lattice structure or as a channel structure. This advantageously creates several alternative options for ventilation or for particle protection for one of the sensor caverns.

One preferred exemplary embodiment of the method according to the present invention provides that a formation and a sealing of the third space are designed as a formation and a sealing of an insulating trench of an electrical via. In this way, a separate formation of the ventilation of the cavern structure may be advantageously dispensed with since the insulating trench region of the electrical via is utilized for these purposes.

Exemplary embodiments of the present invention will be described in greater detail hereafter with reference to the accompanying drawings. All described or illustrated features, either alone or in any arbitrary combination, form the subject matter of the present invention, regardless of the wording or representation thereof in the description or in the drawings. The drawings are primarily intended to illustrate the principles that may be important to the present invention and are not necessarily shown true to scale. In the drawings, identical or functionally equivalent elements have identical reference numerals.

BRIEF DESCRIPTION OF THE DRAWINGS

FIG. 6a shows a detailed view of the fourth exemplary embodiment of the micromechanical component according to the present invention.

FIG. 6b shows a further detailed view of the fourth exemplary embodiment of the micromechanical component according to the present invention.

FIG. 7a shows a detailed view of the fifth exemplary embodiment of the micromechanical component according to the present invention.

FIG. 17a shows a detailed view of the tenth exemplary embodiment of the micromechanical component according to the present invention.

FIG. 18a shows a detailed view of the tenth exemplary embodiment of the micromechanical component according to the present invention.

FIG. 20a shows a detailed view of the eleventh exemplary embodiment of the micromechanical component according to the present invention.

FIG. 25 shows a fourteenth exemplary embodiment of the micromechanical component according to the present invention.

DETAILED DESCRIPTION

Figure 1:
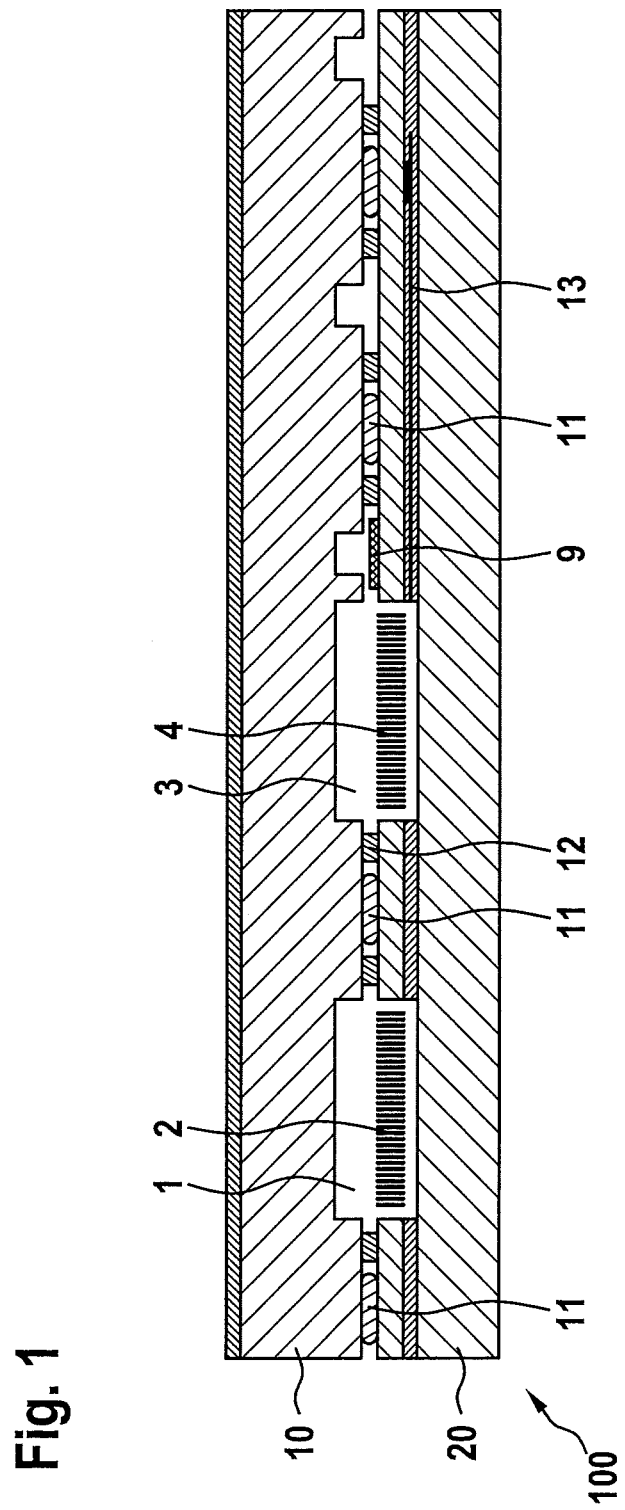
FIG. 1 shows a micromechanical component according to the related art.

FIG. 1 shows a schematic cross-sectional view through a micromechanical component according to the related art. Micromechanical component 100 has a wafer stack composition which is known per se and which includes a cap wafer 10 made of highly doped silicon and a sensor wafer 20 made of silicon, as it is used standard in semiconductor technology. Cap wafer 10 is joined to a sensor wafer 20 with the aid of a bond joint 11 in the form of a eutectic aluminum-germanium joint. Oxide material 12, for example in the form of spacers made of $SiO_2$ between the two wafers 10, 20, is used to situate these spaced from each other in a defined manner. After bonding, wafer 10 is thinned with the aid of methods which are known per se and is provided with a mask layout, e.g., made of silicon dioxide.

A first cavern or a first space 1 is situated within micromechanical component 100, a first functional, movable sensor structure 2 being situated therein. Moreover, a second cavern or a second space 3 is provided, in which a second functional, movable sensor structure 4 is situated. Functional sensor structures 2, 4 are supplied with electrical energy with the aid of electrical lines 13 (e.g., made of doped polysilicon, which is embedded in insulating layers). A trench stop 9 (e.g., a piece of Al) is provided within second space 3 on the upper surface of sensor wafer 20 to stop a trench process which is employed later in a defined manner.

Figure 2:
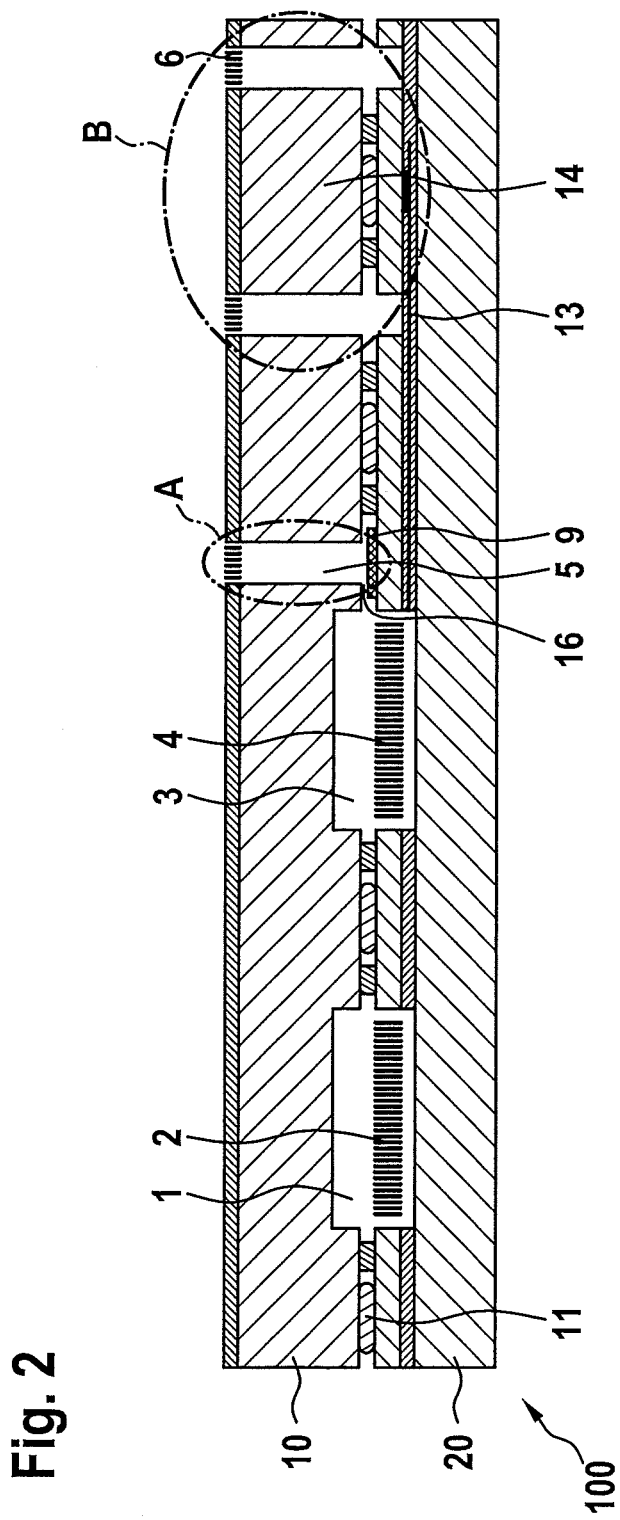
FIG. 2 shows a first exemplary embodiment of the micromechanical component according to the present invention after a bonding process.

FIG. 2 shows a cross-sectional view of a first exemplary embodiment of the micromechanical component according to the present invention. To provide a different internal pressure in second space 3, it is provided to create a lattice structure 6 in a mask layer (e.g., made of $SiO_2$) of cap wafer 10 with the aid of standard lithography and etching methods. This lattice structure 6 is used to provide a ventilation access in the form of a third space 5 with the aid of a silicon trench process. A trench stop 9 (e.g., an aluminum structure) is apparent here, with the aid of which the trench process for producing the ventilation holes on sensor wafer 20 is stopped. In a region in FIG. 2 graphically highlighted with A the ventilation structure is apparent, which has a connecting region 16 to second space 3, via which an internal pressure different from first space 1 is to be provided within second space 3.

A region graphically highlighted with B in FIG. 2 utilizes a further lattice structure 6 to create an insulated via 14 (TSV region or TSV die), which provides an electrically conducting connection to sensors 2, 4 via electrical lines 13. For this purpose, a silicon die is created in cap wafer 10 with the aid of an insulating trench and, at the same time, the epitaxially grown silicon layer (epitaxial silicon), in which sensors 2, 4 are formed, is structurally formed on sensor wafer 20.

Lattice structure 6 is designed as a close meshed oxide lattice mask and configured such that it may be sealed again in a simple manner after the insulation trench process, for example by depositing a further silicon oxide layer. This offers the advantage that it is not necessary to seal the entire insulating trench, and additionally a planar surface of cap wafer 10 is preserved, so that, for example, standard lithography methods may still be employed in subsequent process steps.

It is thus apparent that lattice structures 6 may be used not only to provide the electrically conducting vias 14, but also to form ventilation accesses to the cavern structures.

It is further advantageous that lattice structures 6 make it possible to simultaneously produce electrically conducting vias 14 as well as ventilation accesses.

In this way, the pressure in second space 3 may then be adjusted independently of an internal cavern pressure that is adjusted during a bonding process. As a function of the selection of the deposition method for the sealing layer, an internal pressure may be adjusted, which ranges from a vacuum (e.g., sealing by vapor depositing layers) to atmospheric pressure (e.g., sealing by atmospheric pressure chemical vapor deposition (APCVD) processes). Moreover, as a function of the selection of the process gases used, the damping and/or sticking behavior of the sensors may be influenced, for example.

Figure 3:
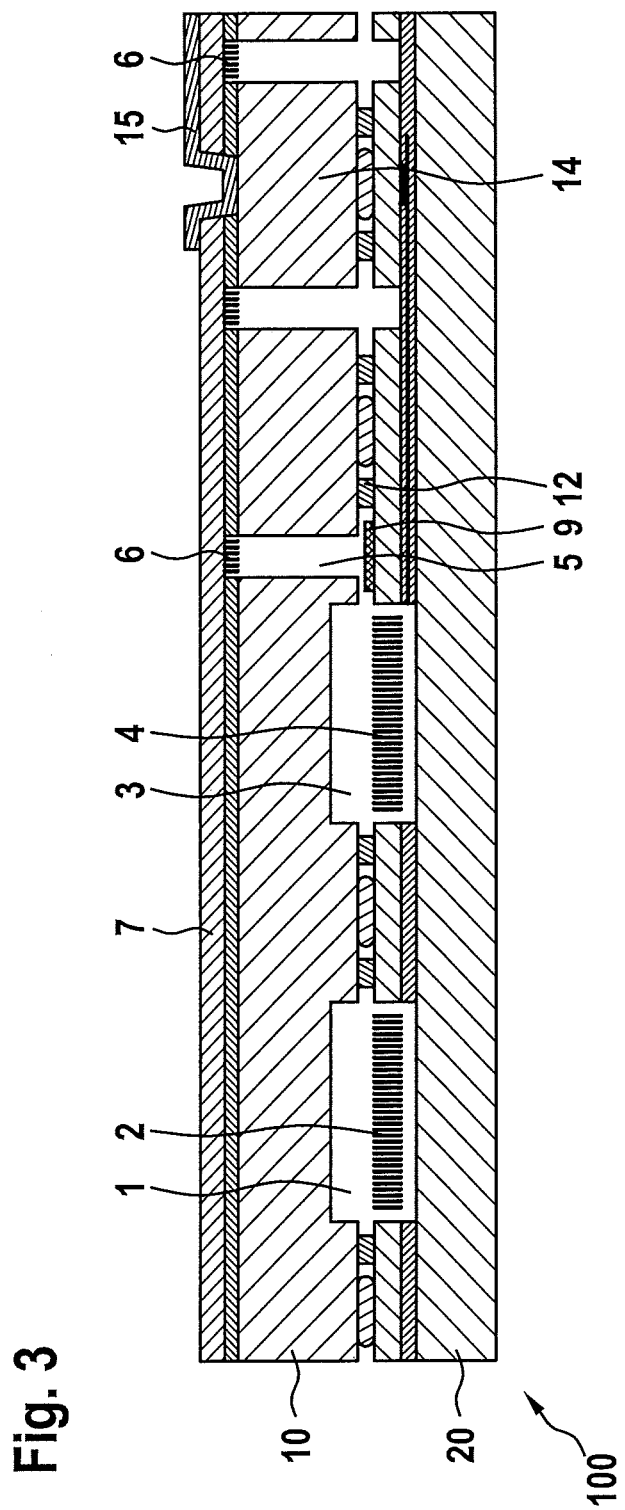
FIG. 3 shows the first exemplary embodiment of the micromechanical component according to the present invention after a final coating process.

FIG. 3 shows the first exemplary embodiment of the micromechanical component according to the present invention after a final coating process with a sealing layer 7 which was formed by depositing a silicon oxide. After sealing with sealing layer 7, standard processes are used to establish an external electrical connection 15 to via 14, e.g., with the aid of aluminum printed conductors. By suitably selecting the layer thickness of oxide material 12 and of the Al structure of trench stop 9, it is possible to dimension the aeration cross section (distance between aluminum and cap wafer 10) in a targeted manner. It may thus be advantageously avoided that particles having a diameter greater than the distance between trench stop 9 and cap wafer 10 may reach second space 3.

Figure 4:
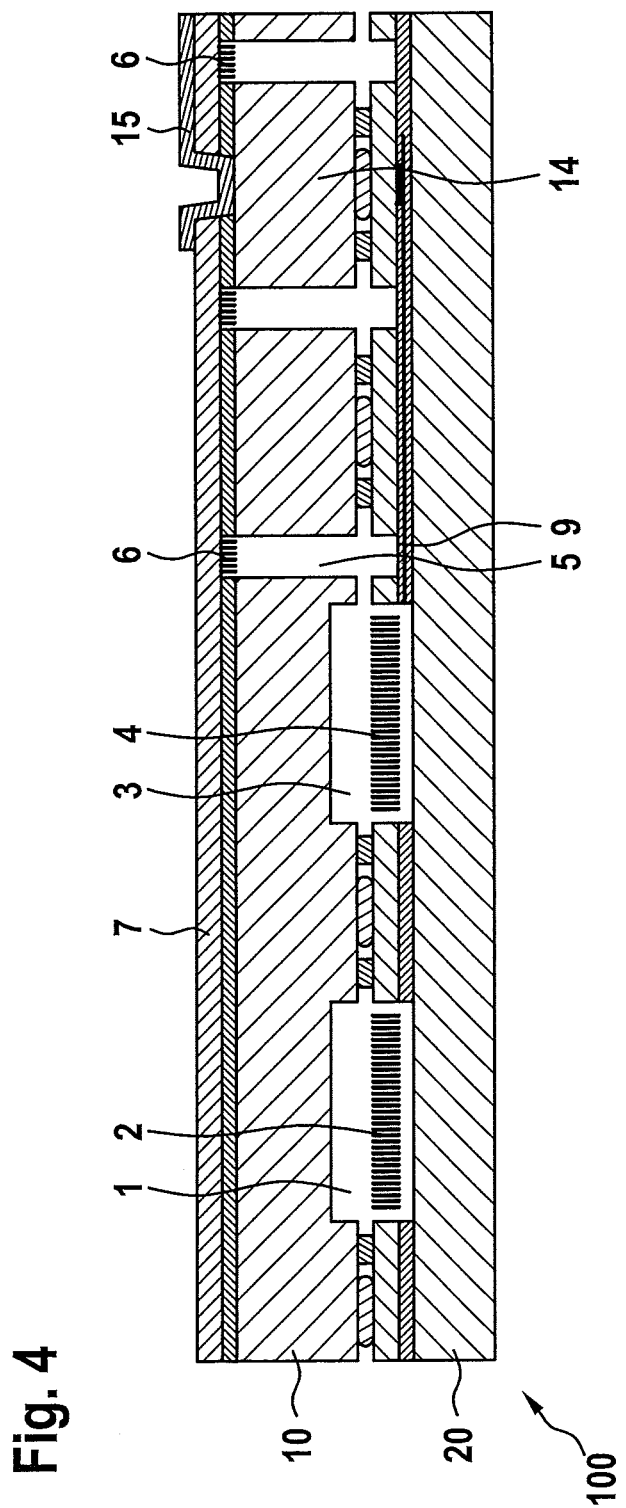
FIG. 4 shows a second exemplary embodiment of the micromechanical component according to the present invention.

FIG. 4 shows a schematic cross-sectional view of a second exemplary embodiment of micromechanical component 100 according to the present invention. In this exemplary variant, trench stop 9 in the region of third space 5 (ventilation cross section) is not provided on an aluminum structure, but on an oxide layer in sensor wafer 20.

Figure 5:
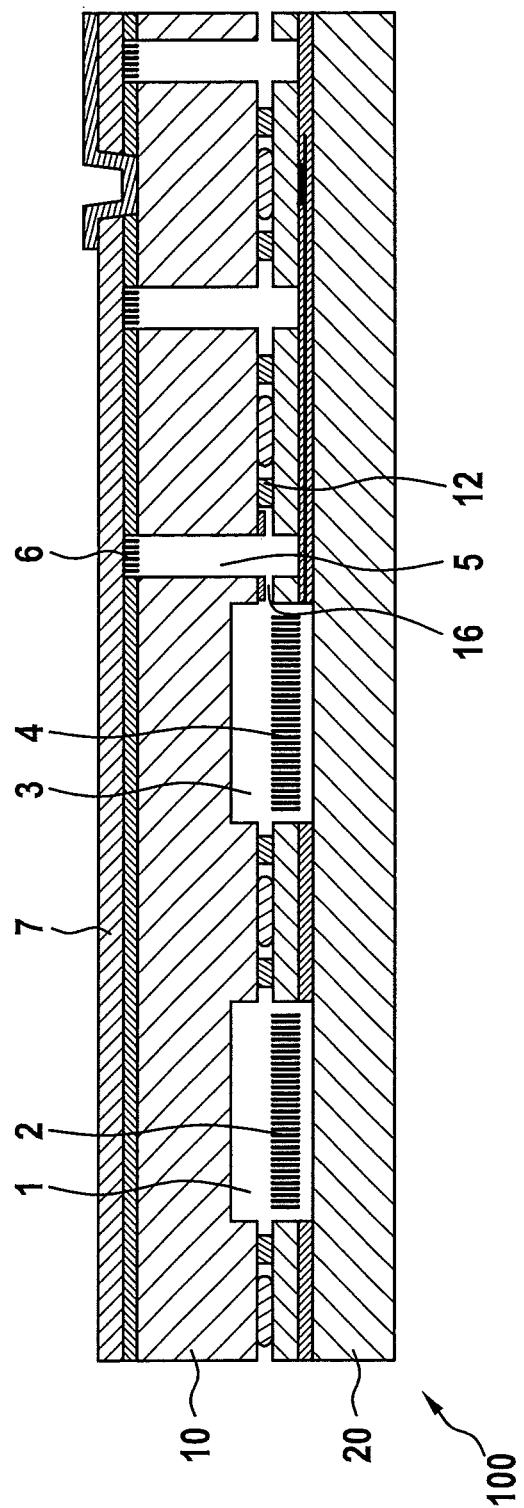
FIG. 5 shows a third exemplary embodiment of the micromechanical component according to the present invention.

FIG. 5 shows one exemplary variant for configuring a connecting region 16 between second space 3 and third space 5 with a third exemplary embodiment of micromechanical component 100 according to the present invention. It is provided for this purpose to adjust a cross-sectional constriction of connecting region 16 via a relationship of the germanium thickness to a thickness of oxide material 12 for the spacers between cap wafer 10 and sensor wafer 20. The germanium is generally located on a front side of cap wafer 10 and is etched through locally when third space 5 is manufactured. In this exemplary variant, the etching stop is again on an oxide layer in substrate wafer 20.

Figure 6:
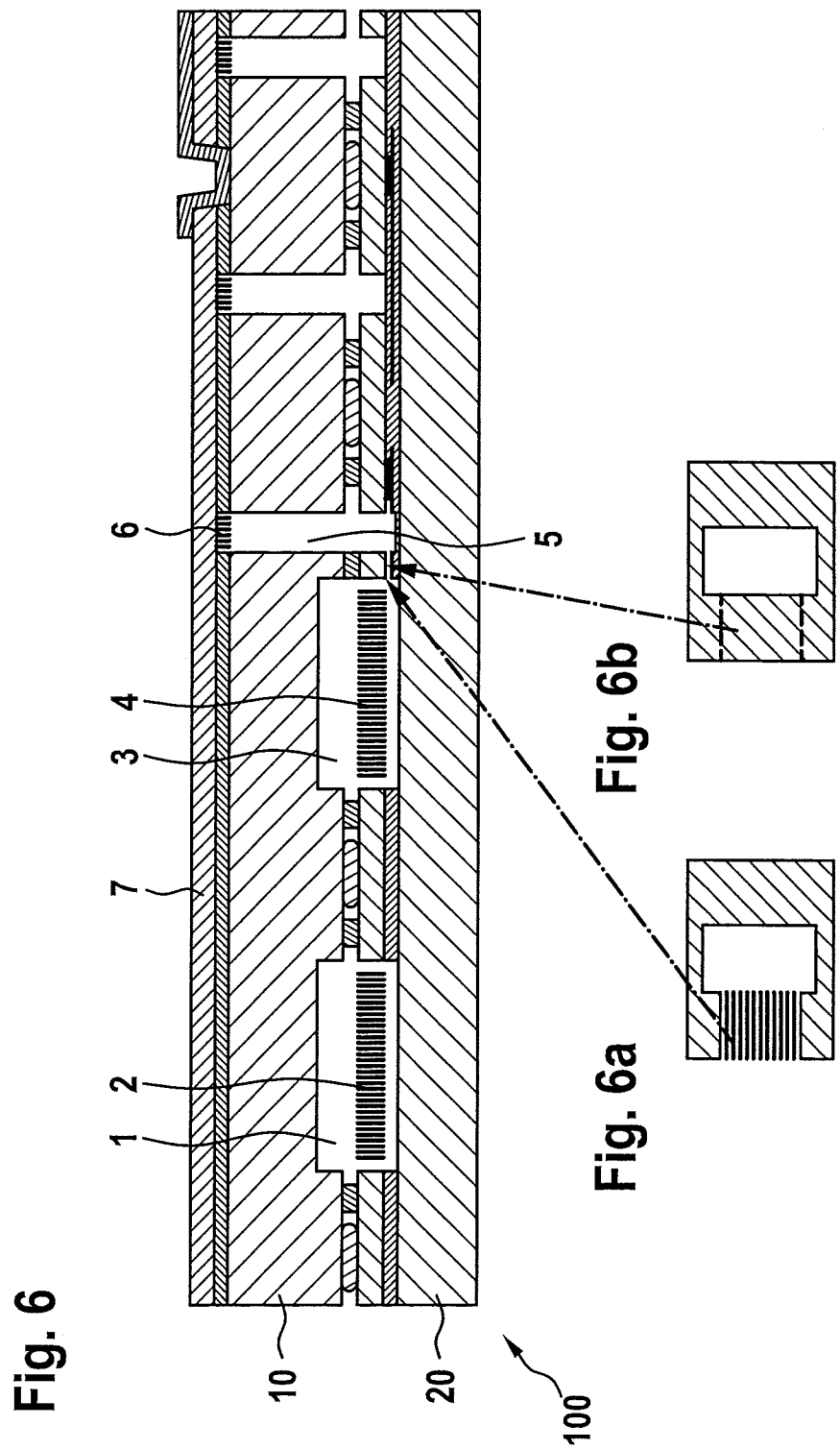
FIG. 6 shows a fourth exemplary embodiment of the micromechanical component according to the present invention.

FIG. 6 shows a fourth exemplary embodiment of the micromechanical component according to the present invention. Together with FIGS. 6a and 6b, two different exemplary variants for configuring connecting region 16 between second space 3 and third space 5 are apparent. It is apparent in FIG. 6a that connecting region 16 is designed as an essentially lateral lattice structure. It is advantageous in this exemplary variant to provide a spacer structure made of oxide material over the lattice structure on the front side of cap wafer 10, the spacer structure closing the surface of the lattice structure. In this way, a ventilation access is formed in third space 3 by the lattice structure and in part beneath it. In this exemplary variant as well, an etching process for creating the ventilation structure stops on an oxide layer in substrate wafer 20.

According to FIG. 6b, access region 16 into second space 3 is designed as a channel structure. This is formed by creating a frame piece between second space 3 and third space 5 by a design configuration on sensor wafer 20, the frame piece being undercut during sacrificial oxide etching and in this way establishing a connection between second space 3 and third space 5.

Through a design configuration of individual levels in the sensor manufacturing process, it may be achieved that a height of the channel structure is only dependent on the height of the last oxide layer on the polysilicon structure in sensor wafer 20. This polysilicon structure need not necessarily be electrically connected, but may serve only as a protective etching mask for the oxide layer located beneath. During trenching of the ventilation holes, this polysilicon structure is at least partially removed. The etching process then stops on the oxide layer located beneath.

In this exemplary variant as well, a spacer structure made of oxide material may be provided on the side of cap wafer 10 over the access channel, the spacer structure being configured such that an access into second space 3 may only take place through the channel structure. In this exemplary variant, the connecting region 16 is thus formed with the aid of a cross section reduction by local undercutting of the epitaxial silicon layer.

Figure 7:
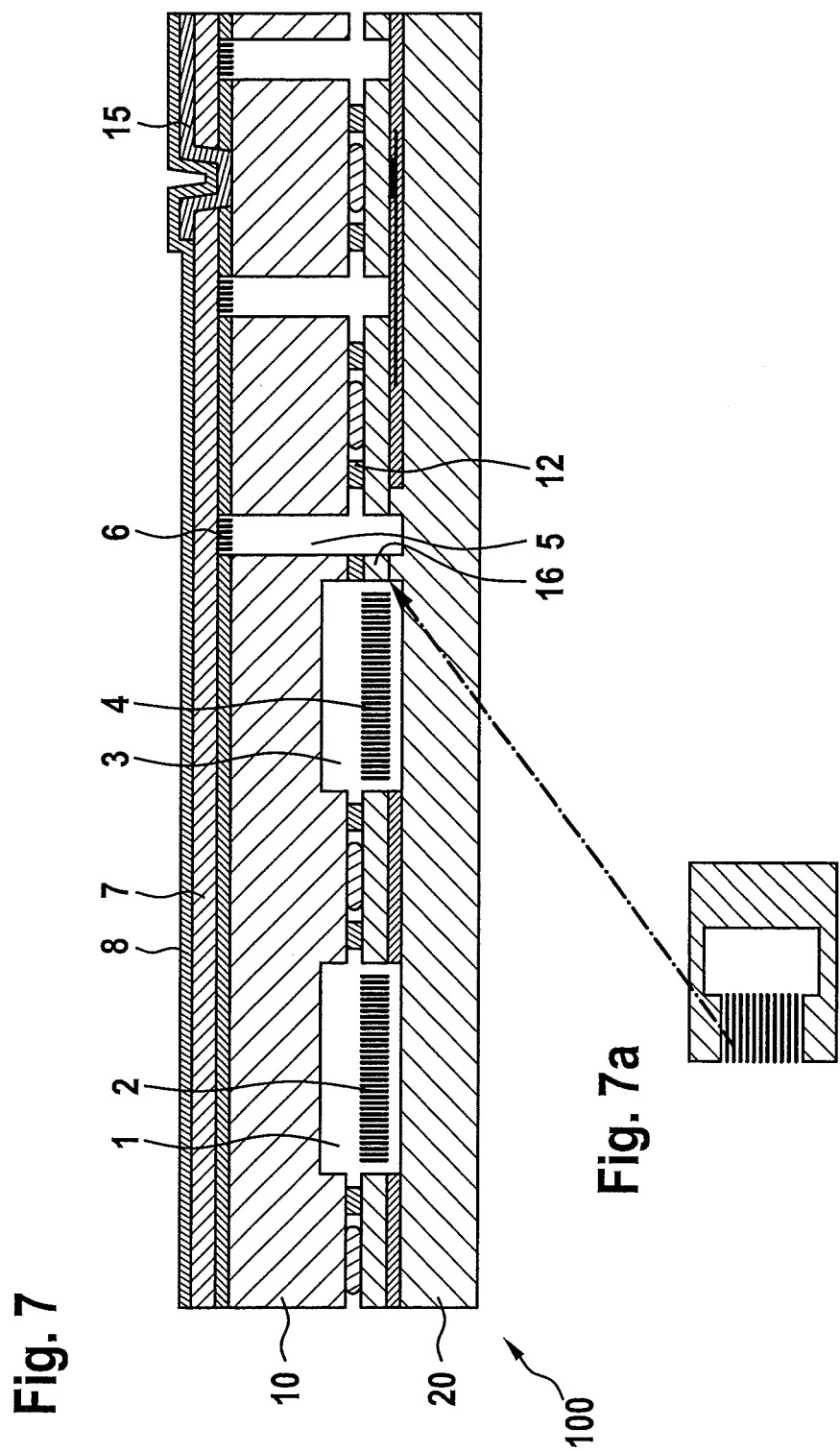
FIG. 7 shows a fifth exemplary embodiment of the micromechanical component according to the present invention.

FIG. 7 shows a fifth exemplary embodiment of micromechanical component 100 according to the present invention. In this exemplary variant, it is provided that additionally at least one passivation layer is, preferably multiple passivation layers 8 are, applied to the layer system in a completion method. In the region of the bond pads, passivation layers 8 are removed to enable electrical contacting, for example by wire bonding (not shown).

The penetration of moisture into the layer system located beneath, in particular into third space 5 and second space 3 connected thereto, may advantageously be prevented with the aid of passivation layer 8. In this case as well, as is apparent from FIG. 7a, connecting region 16 between second space 3 and third space 5 is designed as a cross-section reduction in the form of a lateral lattice structure in the epitaxial silicon layer. It is apparent that third space 5 was created without the use of an etching stop.

Materials which may be used for passivation layer 8 are, for example, silicon oxide, silicon nitride, silicon carbide, silicon oxynitride or a combination of these materials. Moreover, passivation layers 8 may also be used for passivation or for protecting external electrical printed conductors.

Figure 8:
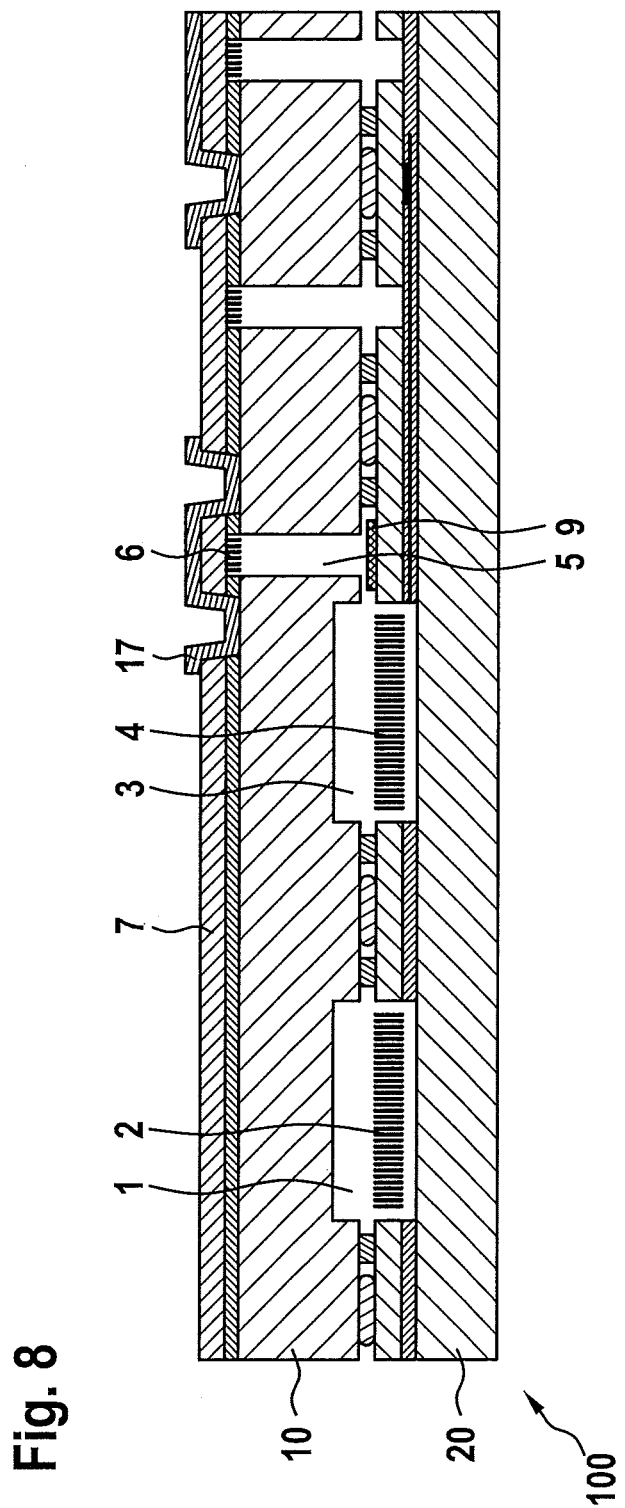
FIG. 8 shows a sixth exemplary embodiment of the micromechanical component according to the present invention.

FIG. 8 shows a sixth exemplary embodiment of micromechanical component 100 according to the present invention. In this exemplary variant, a metal layer 17 is situated over third space 5 above sealing layer 7. In this way, the metal for establishing the external electrical contact 15 may also be used to prevent moisture from penetrating into the sensor-internal caverns. Shown is only one possible exemplary embodiment, it also being possible for metal layer 17 to be situated over the sealed insulating trench structures (not shown) to prevent moisture from penetrating into the insulating trench region and to prevent the resulting leakage currents. In this exemplary variant, it is also optionally possible to additionally provide one or more passivation layers 8, between which also structured metal layers, as they are used, for example, standard in semiconductor technology, may be embedded.

The exemplary embodiments of micromechanical component 100 according to the present invention described so far all have the ventilation structures in the form of third space 5 on the side of cap wafer 10, the electrical vias 14 being only provided outside the bond frame region.

However, it is also conceivable to provide electrical via 14 within first space 1 or within second space 3. This, however, calls for a greater space requirement, which generally results in an increase in the bond frame and thus of the cavern region. A lateral expansion of the cavern region, however, also results in a larger silicon diaphragm spanning the cavern region, whose mechanical stability with regard to a pressure load, as it may occur during molding, decreases. While this may be counteracted by thickening of the diaphragm, it results in longer process times for the insulating trench on the TSV and the ventilation structures and further impedes the manufacture of preferably geometrically compact sensors.

In the preceding examples, the electrical contacting of the sensor structures was carried out via external electrical connection 15, electrical via 14, the eutectic AlGe bond joint, and electrical printed conductors 13 made of polysilicon.

To be able to place electrical vias 14 also in the region of the bond frame, further exemplary embodiments of micromechanical component 100 according to the present invention will be described hereafter, which make this possible and in which the electrical connection of the sensor structures is carried out from the back of sensor wafer 20. In these exemplary variants, a direct electrical connection between electrical via 14 and printed conductor 13 made of polysilicon is possible, whereby TSV structures in the bond frame region also become possible. To minimize the line resistance in these exemplary variants, sensor wafer 20 ideally has a maximum substrate doping, while cap wafer 10 may be made of standard material.

Figure 9:
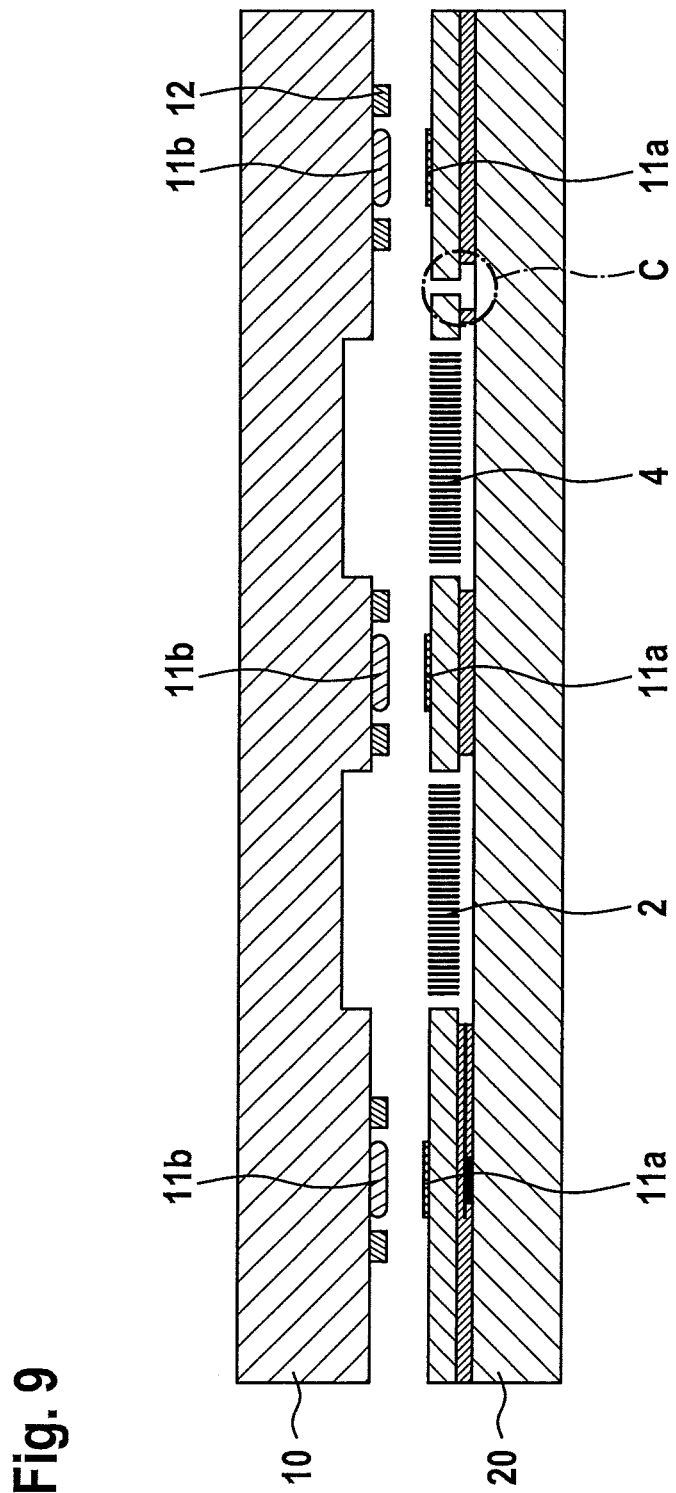
FIG. 9 shows a seventh exemplary embodiment of the micromechanical component according to the present invention prior to the bonding process.

FIG. 9 shows a seventh exemplary embodiment of micromechanical component 100 according to the present invention. Cap wafer 10 and sensor wafer 20 prior to a bonding process are apparent. For this purpose, first bonding elements 11a are situated on sensor wafer 20 and second bonding elements 11b are situated on cap wafer 10, which eutectically fuse with each other during the bonding process. During the structuring process of movable sensor structures 2, 4, ventilation holes are also provided in the epitaxial silicon layer on sensor wafer 20. In a sacrificial oxide etching process, the oxide is then also removed from these ventilation holes, whereby access to the bulk silicon of sensor wafer 20 is made possible. This is shown in FIG. 9 by a graphical highlight C.

Figure 10:
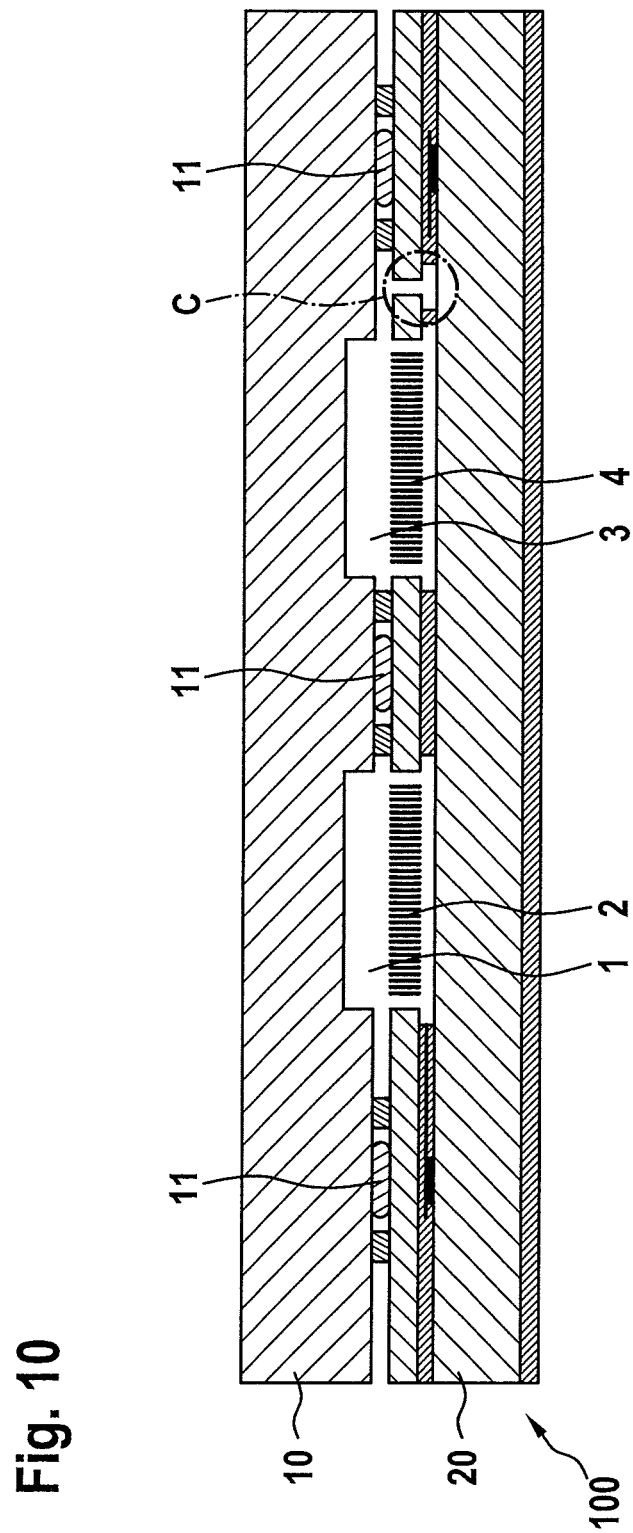
FIG. 10 shows the seventh exemplary embodiment of the micromechanical component according to the present invention after the bonding process.

FIG. 10 shows micromechanical component 100 in FIG. 9 after the eutectic aluminum-germanium bonding has been carried out.

Figure 11:
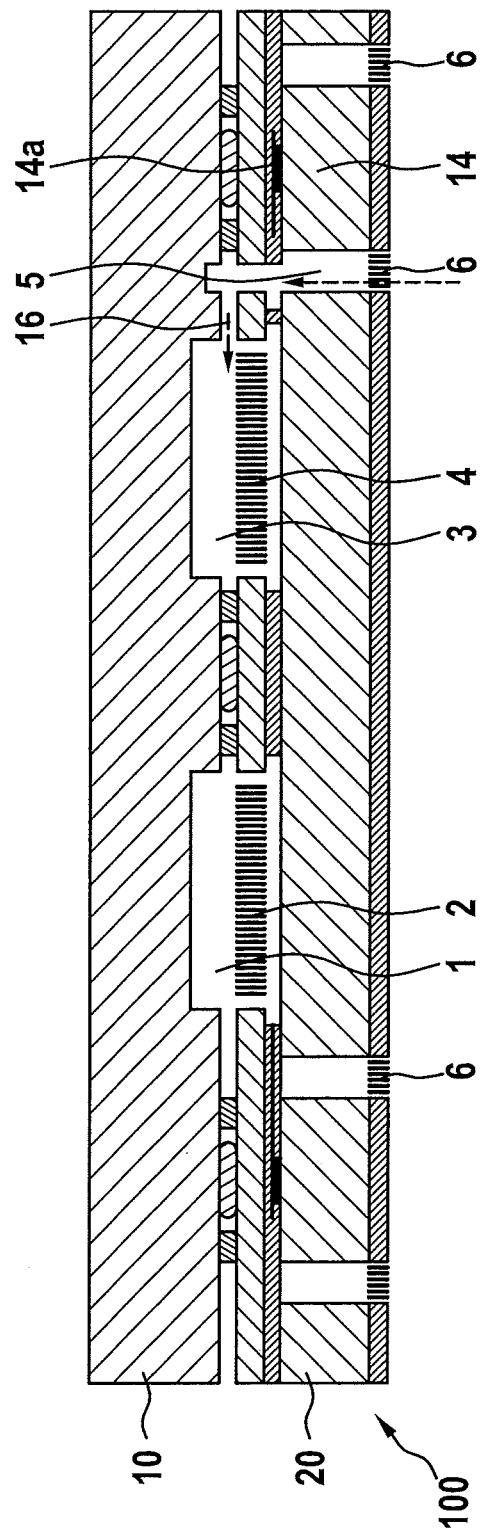
FIG. 11 shows the seventh exemplary embodiment of the micromechanical component according to the present invention after formation of the ventilation channel.

FIG. 11 shows the seventh exemplary embodiment of micromechanical component 100 according to the present invention after formation of the ventilation channel. A mask layer (for example, made of silicon oxide) was again deposited on the sensor back for this purpose, and lattice structures 6 for forming the insulating trench of electrical vias 14 were created. It is apparent that with a suitable design configuration, the ventilation holes of the epitaxial silicon layer are positioned such that they are situated in the region of the insulating trench of electrical vias 14. In this way a separate third space 5 may be advantageously dispensed with, whereby micromechanical component 100 may be designed to be even more compact.

It is also apparent from FIG. 11 that third space 5 is integrated into the insulating trench region of electrical via 14. While the etching process of the described insulating trench region stops at a base point, connecting region 16 into second space 3 is opened at the same time. The ventilation path of second space 3 is indicated with the aid of arrows. It is apparent that etching was carried out into cap wafer 10 up to a certain degree.

Figure 12:
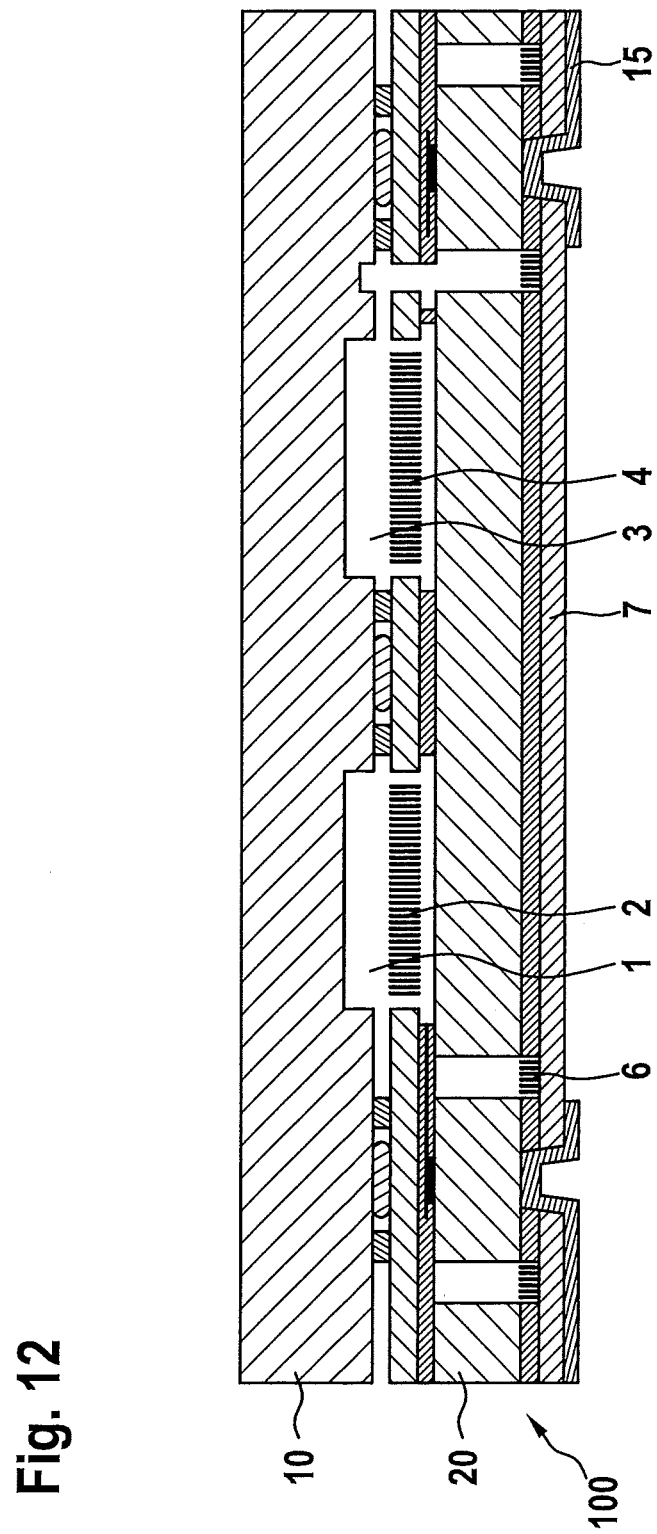
FIG. 12 shows the seventh exemplary embodiment of the micromechanical component according to the present invention after completion.

As is apparent from FIG. 12, lattice structure 6 in this exemplary variant as well is again sealed with a sealing layer 7 made of silicon oxide, and external electrical connections 15 of via 14 are implemented, for example with the aid of aluminum printed conductors.

Multiple options exist for forming connecting region 16 into second space 3.

Figure 13:
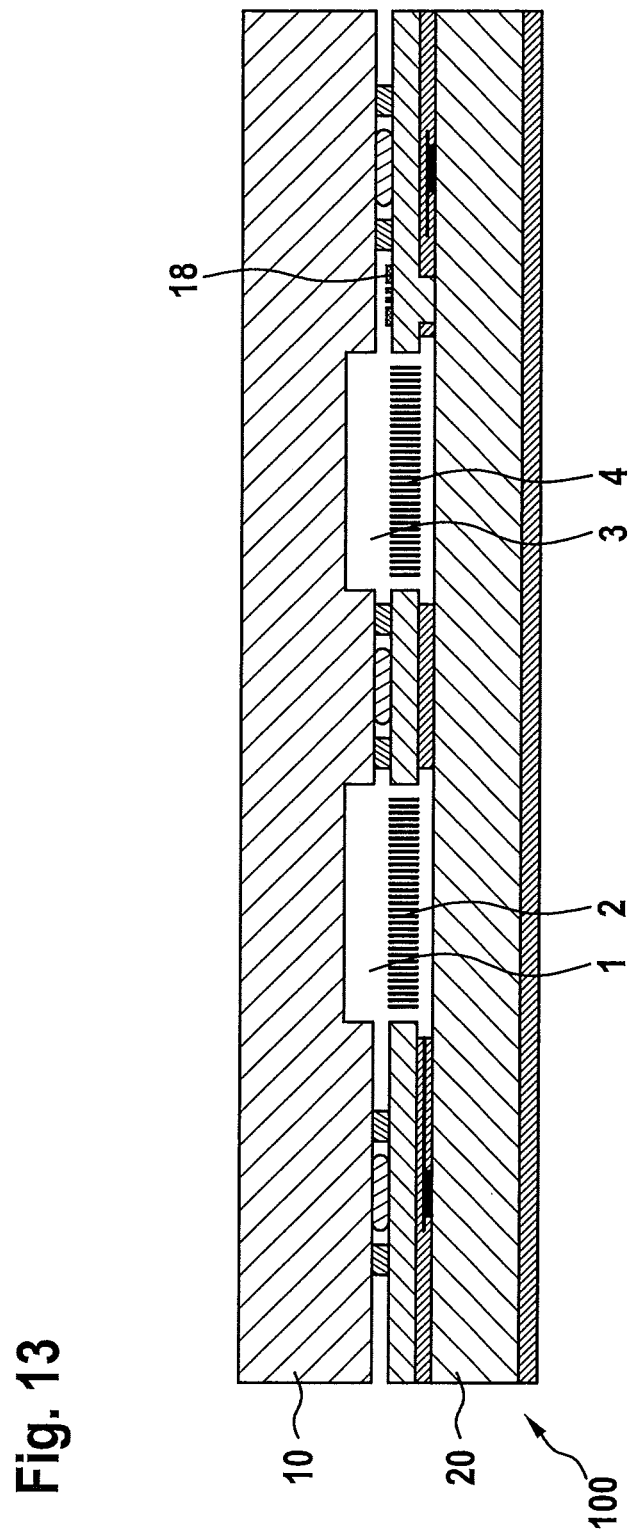
FIG. 13 shows an eighth exemplary embodiment of the micromechanical component according to the present invention.

FIG. 13 shows, for example, that this is possible with the aid of a metal lattice 18 (e.g., made of aluminum) which is situated on a front side of sensor wafer 20. The insulating trench formed with the aid of lattice structure 6 partially exposes this metal lattice 18 and in this way opens up an access into second space 3. Metal lattice 18 may advantageously again assume a filter function for second space 3 to filter out harmful particles. A maximum size of particles which may reach second space 3 may be defined by a mesh size of metal lattice 18 or by a distance between a metal layer of metal lattice 18 and cap wafer 10.

Figure 14:
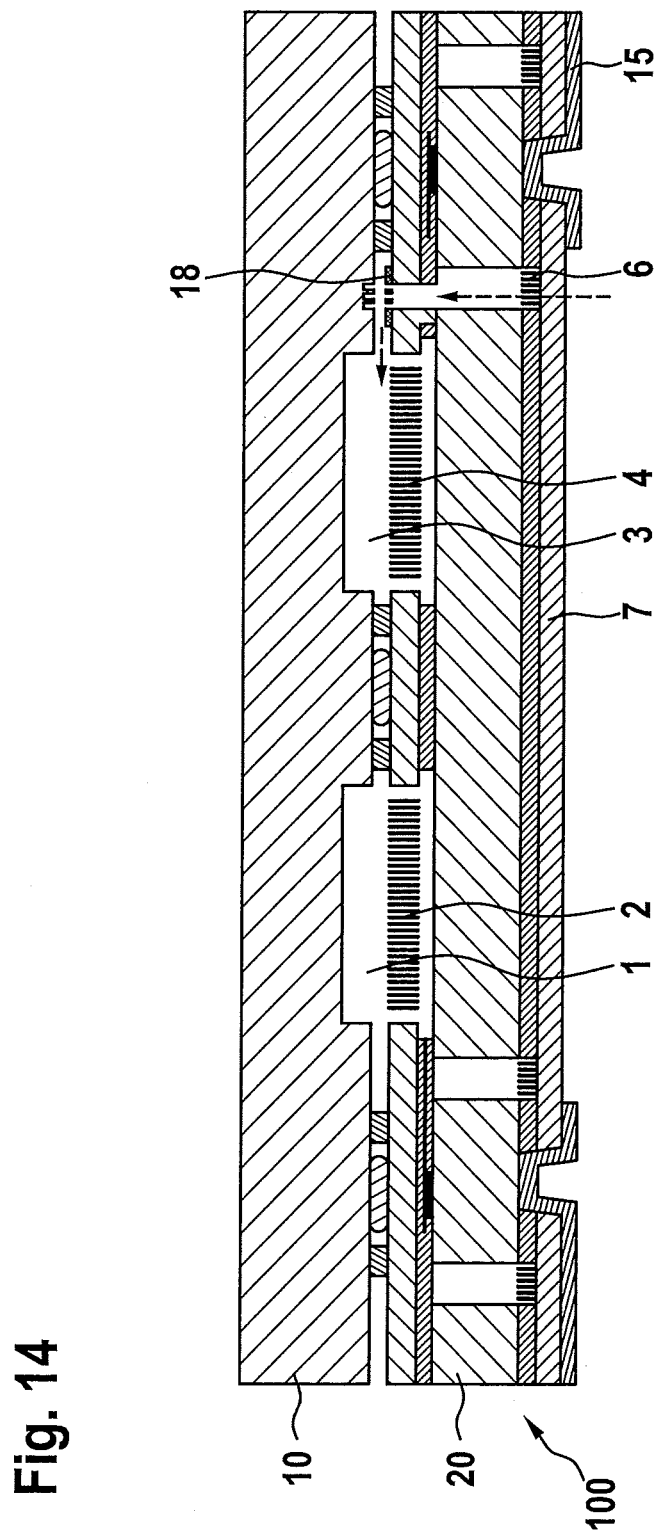
FIG. 14 shows the eighth exemplary embodiment of the micromechanical component according to the present invention after completion.

FIG. 14 basically shows the ventilation access into second space 3 with the aid of dotted arrows.

Figure 15:
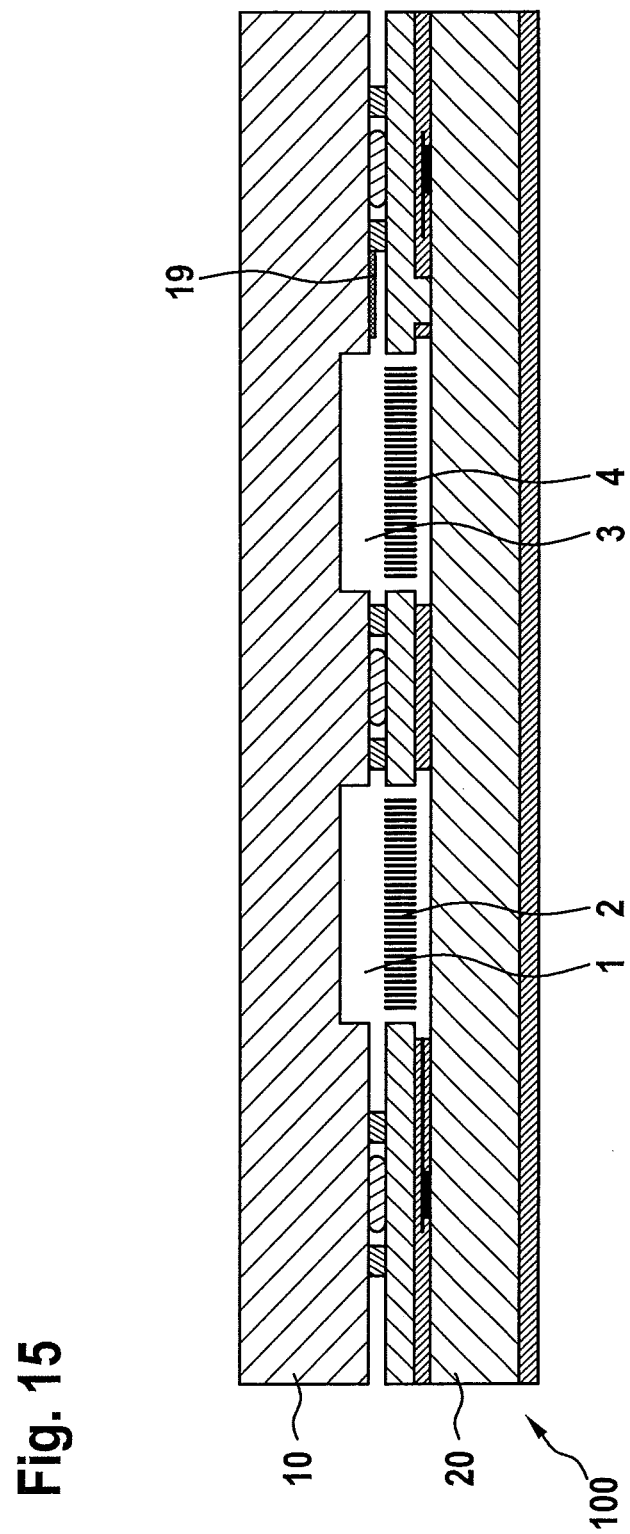
FIG. 15 shows a ninth exemplary embodiment of the micromechanical component according to the present invention.
Figure 16:
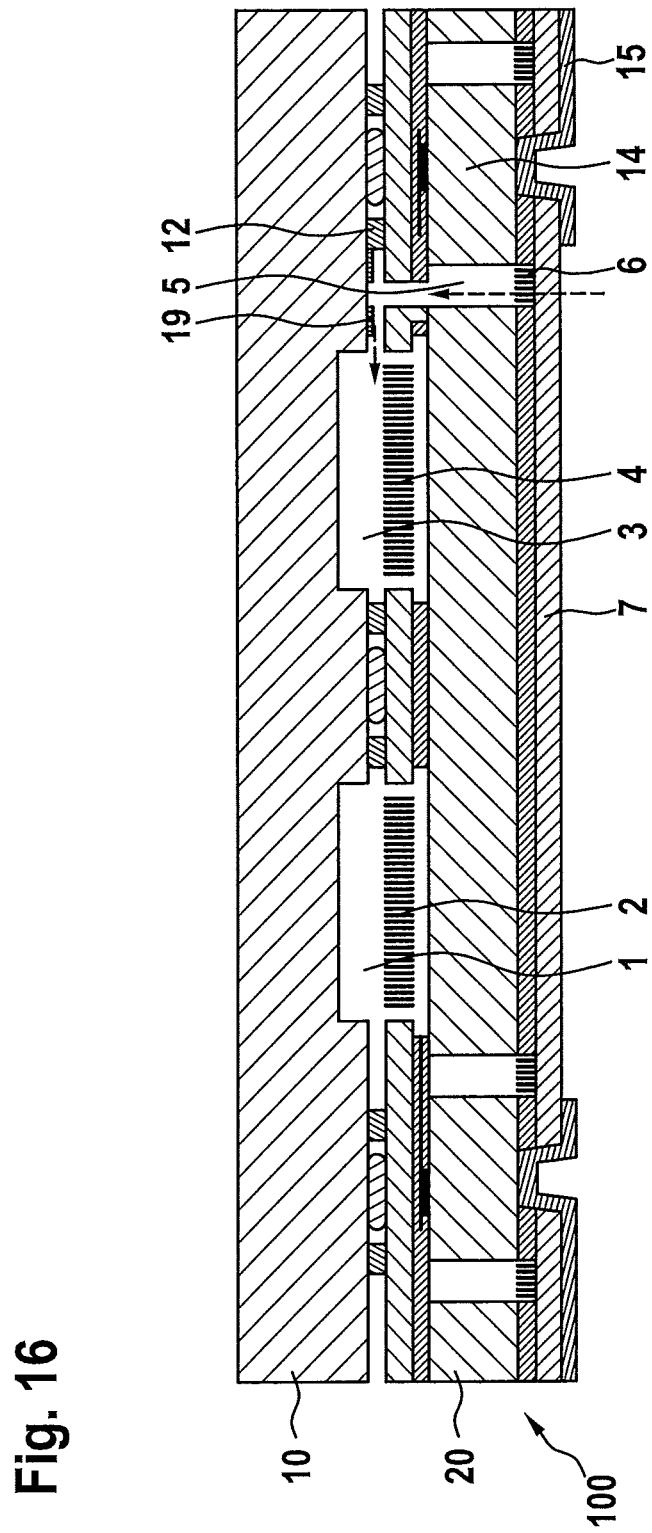
FIG. 16 shows the ninth exemplary embodiment of the micromechanical component according to the present invention after completion.

FIGS. 15 and 16 show a ninth exemplary embodiment of micromechanical component 100 according to the present invention. The delimitation of a channel height between cap wafer 10 and sensor wafer 20 with the aid of a delimiting element 19 is provided for. Delimiting element 19 may, for example, be made of germanium (FIG. 16) or SiO$_2$ (FIG. 15). Since the insulating trench process does not selectively etch for germanium, this is removed locally in the region of third space 5. A remaining Ge ring in this way assumes a definition of a channel height to second space 3. In the event that germanium is replaced with a silicon oxide layer, which is designed to be thinner than an oxide material 12, an etching stop may be implemented on this silicon oxide layer.

Figure 17:
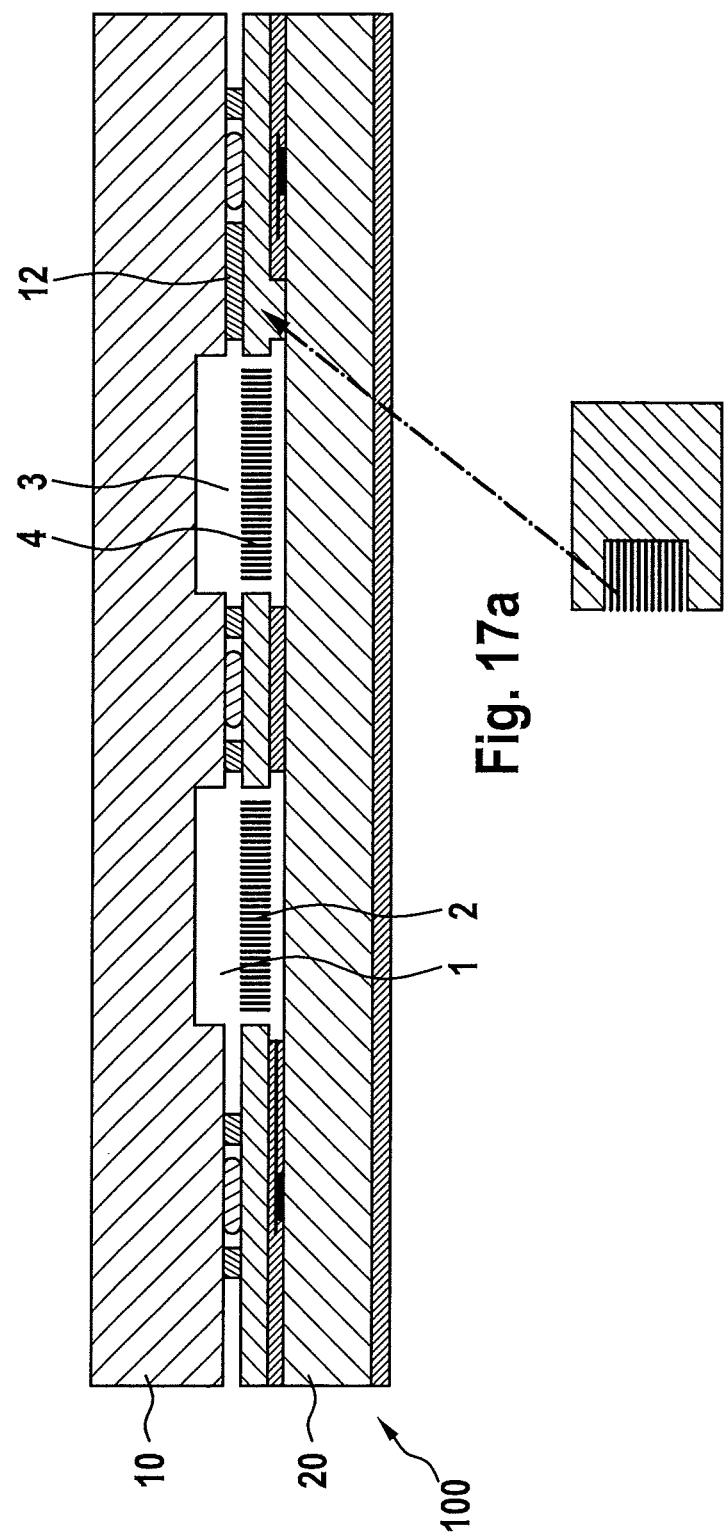
FIG. 17 shows a tenth exemplary embodiment of the micromechanical component according to the present invention.
Figure 18:
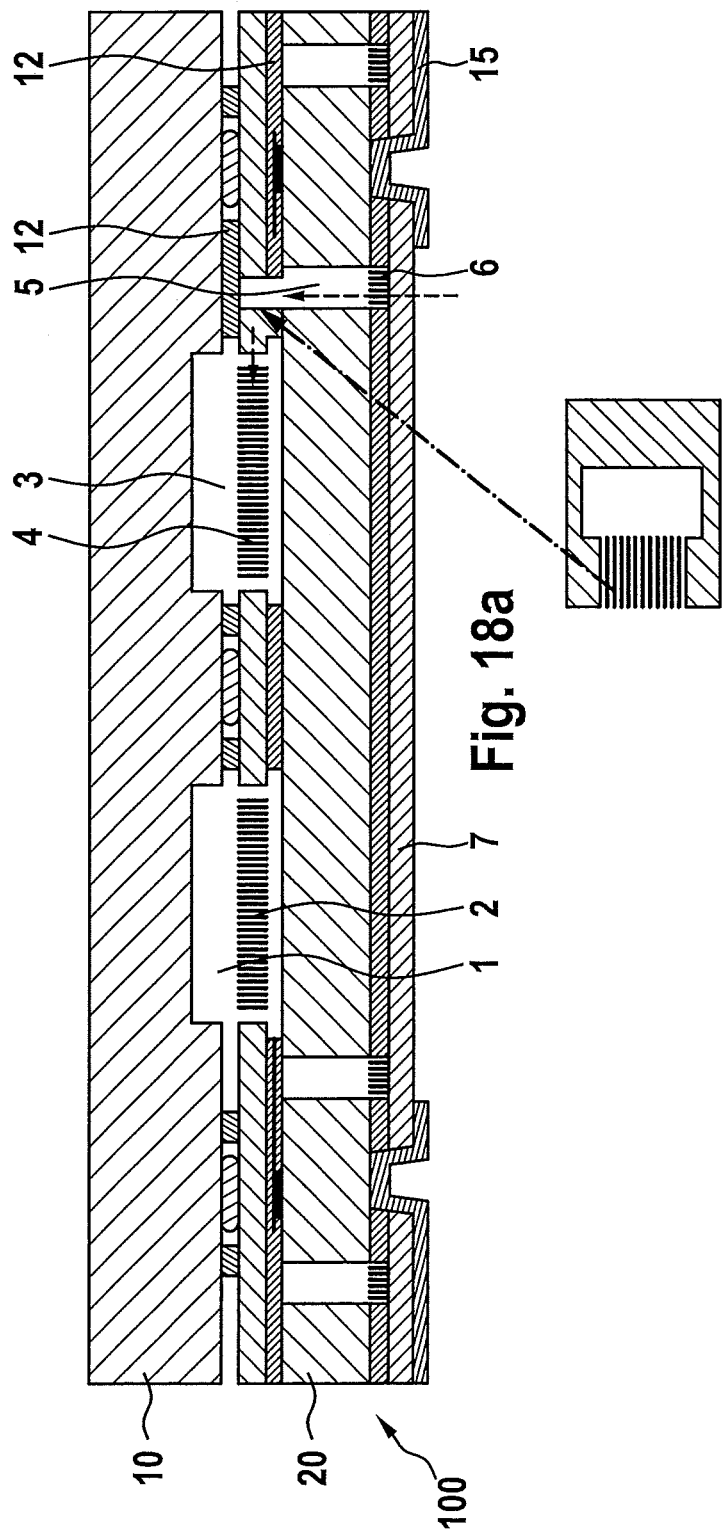
FIG. 18 shows the tenth exemplary embodiment of the micromechanical component according to the present invention after completion.

FIGS. 17 and 18 show a tenth exemplary embodiment of micromechanical component 100 according to the present invention. Similarly to FIG. 7, a trenched, lateral lattice is formed as the connecting region into second space 3 in this exemplary variant. FIGS. 17a and 18a show top views onto this lattice in different manufacturing stages. If an oxide material 12 is provided in the region of the lattice, surface sealing of the lattice and an etching stop for the insulating trench in the region of third space 5 may be achieved.

Ventilation of second space 3 may then be carried out through the essentially lateral lattice.

Figure 19:
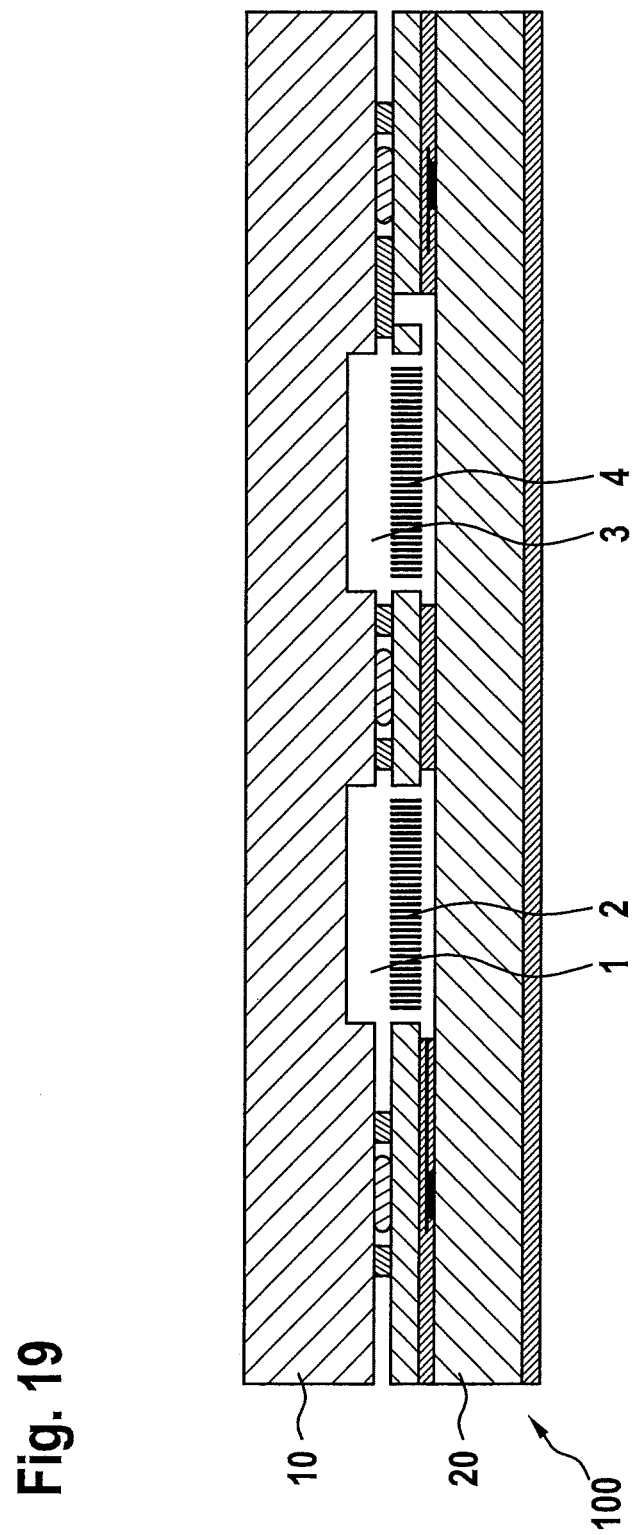
FIG. 19 shows an eleventh exemplary embodiment of the micromechanical component according to the present invention.
Figure 20:
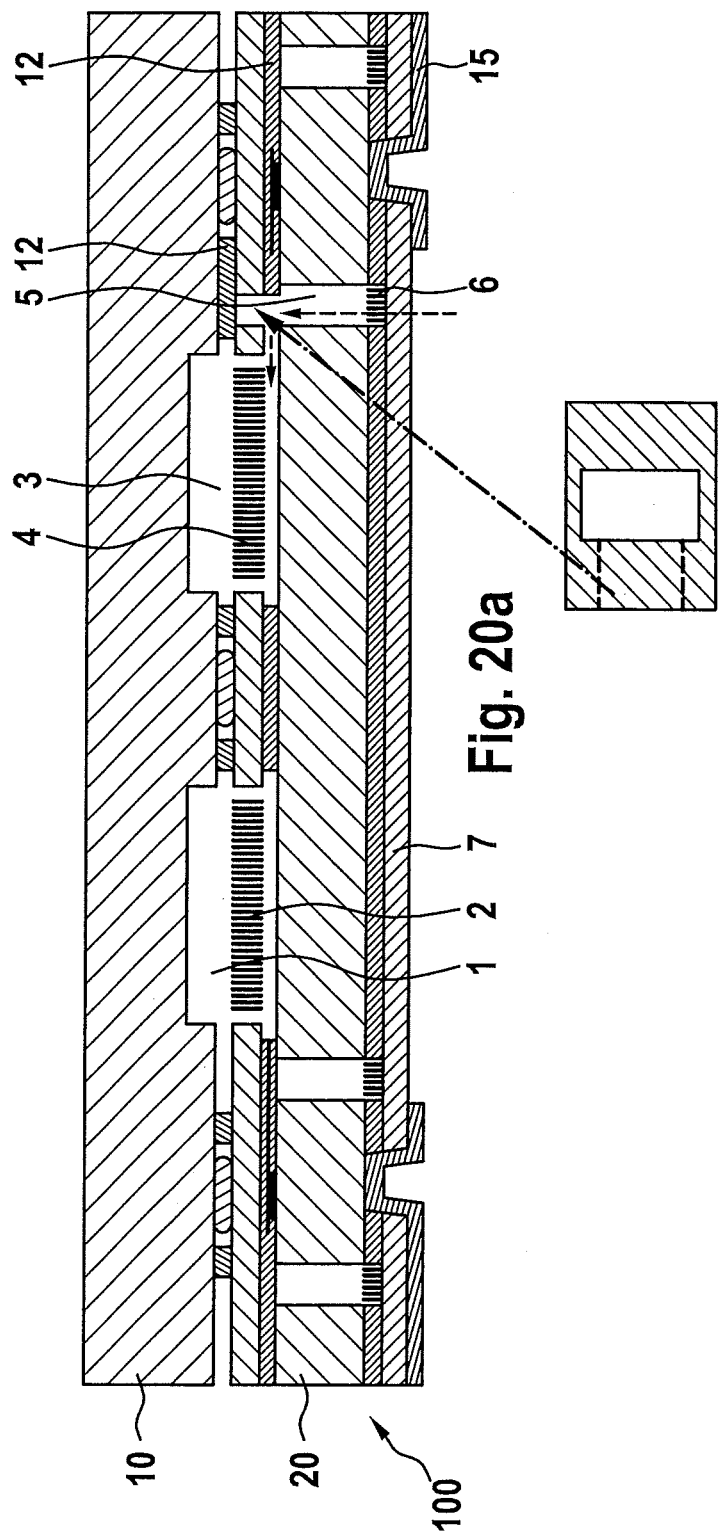
FIG. 20 shows the eleventh exemplary embodiment of the micromechanical component according to the present invention after completion.

FIGS. 19 and 20 show an eleventh exemplary embodiment of micromechanical component 100 according to the present invention, in which a channel structure is created beneath the epitaxial silicon layer by removing sacrificial oxide. The insulating trench of electrical via 14 or third space 5 exposes this channel and stops on a spacer made of oxide material 12 (oxide spacer structure) of cap wafer 10. FIG. 20a shows a schematic top view onto a schematic design of the described channel structure.

Figure 21:
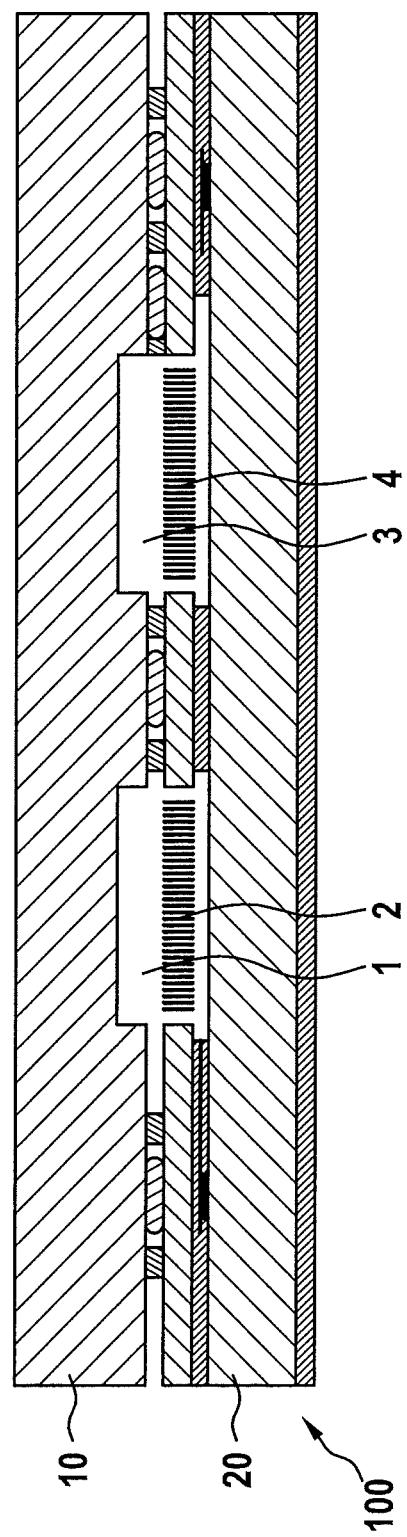
FIG. 21 shows a twelfth exemplary embodiment of the micromechanical component according to the present invention.
Figure 22:
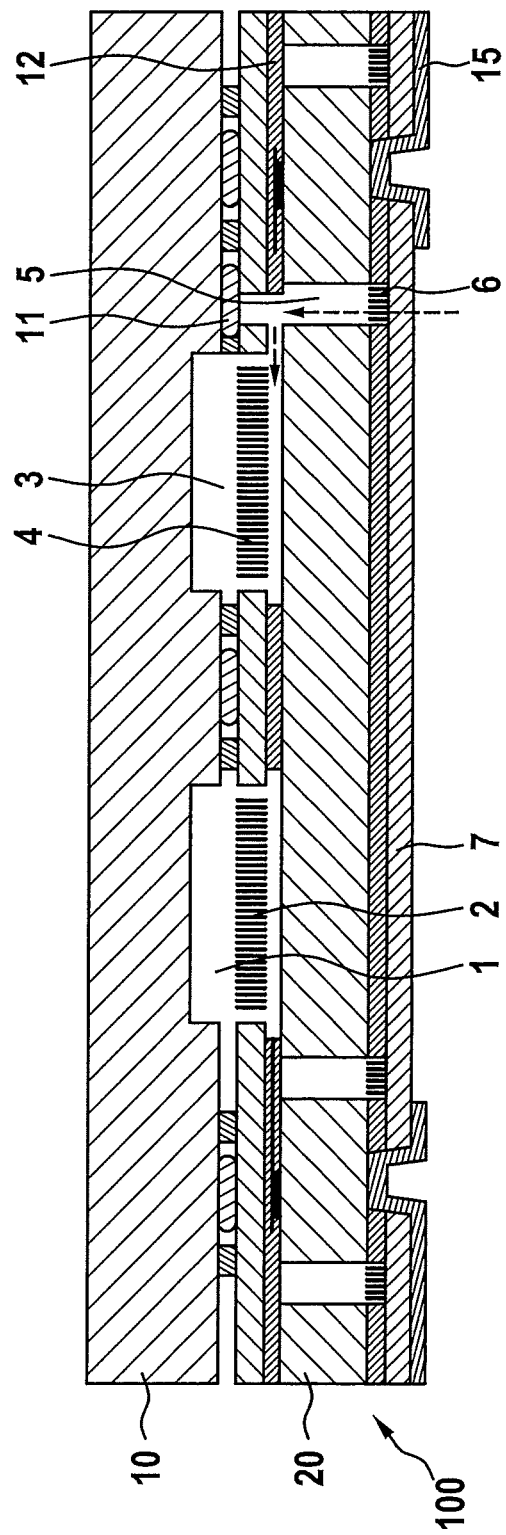
FIG. 22 shows the twelfth exemplary embodiment of the micromechanical component according to the present invention after completion.

FIGS. 21 and 22 show a twelfth exemplary embodiment of micromechanical component 100 according to the present invention. In this exemplary variant, the ventilation structure, or the trench process creating third space 5, stops on a eutectically created bond joint 11, e.g., made of aluminum-germanium.

Figure 23:
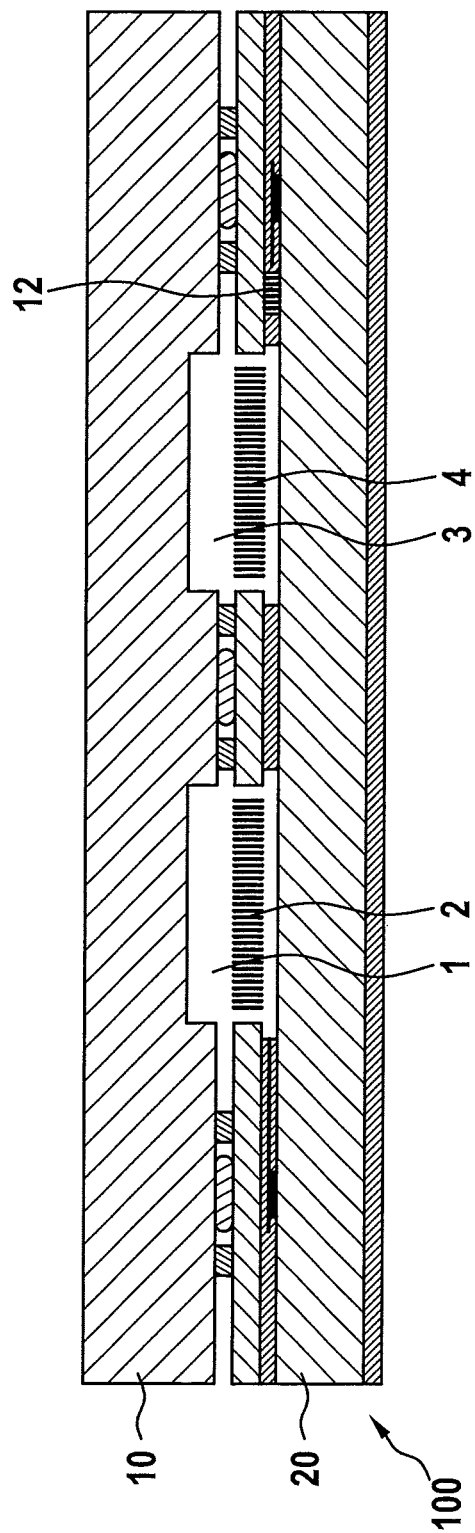
FIG. 23 shows a thirteenth exemplary embodiment of the micromechanical component according to the present invention.
Figure 24:
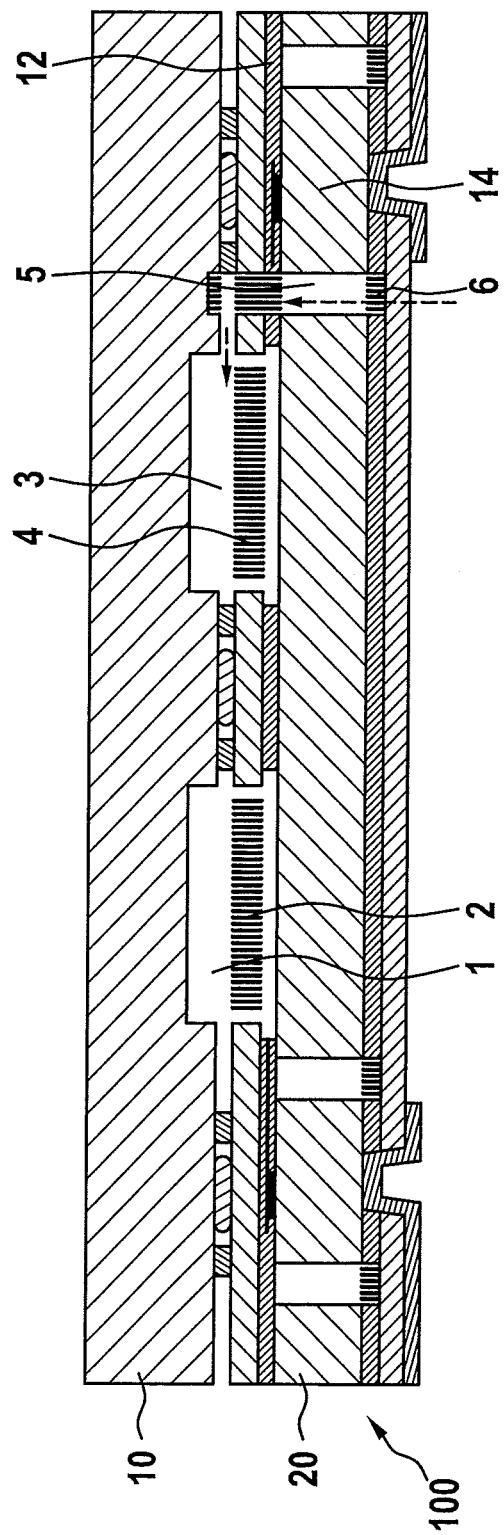
FIG. 24 shows the thirteenth exemplary embodiment of the micromechanical component according to the present invention after completion.

FIGS. 23 and 24 show a thirteenth exemplary embodiment of micromechanical component 100 according to the present invention. In this exemplary variant, oxide material 12 is structured, e.g., in a lattice shape, prior to depositing the epitaxial silicon. It is possible in this way to be able to simultaneously structure the epitaxial silicon in a lattice shape, even when carrying out the insulating trench. In this way, a vertical lattice structure may be created, which advantageously provides a ventilation option to second space 3 and represents a penetration protection for particles.

FIG. 25 shows a further schematic representation of a fourteenth exemplary embodiment of micromechanical component 100 according to the present invention. In this exemplary variant, third space 5 is filled with a filler material 21. Due to the prior formation of the lattice structure in the epitaxial silicon, filler material 21 is prevented from reaching second space 3.

The filling of third space 5 with filler material 21 is basically conceivable for all above-described exemplary variants of the micromechanical component in which a channel constriction is provided to keep particles out of second space 3. When filling third space 5 with a conductive material, e.g., AuSn, care must be taken that previously a continuous insulating layer was deposited in third space 5, since otherwise an electrical short circuit would take place between via 14 and the bulk silicon of sensor wafer 20. Filler material 21 may moreover also be, for example, SiO$_2$ or benzocyclobutene (BCB).

In all described exemplary variants, it is also conceivable to introduce a substance through third space 5 in a targeted manner into second space 3, which prevents movable finger structures from adhering to each other (antistiction coating).

In summary, the present invention provides a method which advantageously allows a simultaneous manufacture of inertial sensors on a single wafer, the internal pressure of caverns in which, for example, acceleration sensors are located being able to be varied arbitrarily.

However, it is also possible, of course, that the described exemplary methods are applied not only for manufacturing acceleration and yaw rate sensors on one wafer. Rather, in this way arbitrary sensors may be manufactured, such as infrared sensors, pressure sensors, magnetic field sensors, etc. It is advantageously also conceivable to arbitrarily combine the exemplary variants described here with each other, so that the present invention also encompasses exemplary embodiments which are not described above or are described above only in part.

The described exemplary methods are not limited to a specific eutectic joining process of cap wafer and sensor wafer. Rather they may be employed in all known bonding methods.

Those skilled in the art will suitably modify the described features or combine them with each other, without departing from the core of the present invention.

What is claimed is:
1. A micromechanical component, comprising:
 a first space in which a first sensor is situated and a second space in which a second sensor is situated, pressures prevailing in each of the first and second spaces being different, wherein one of the two spaces extends via a third space to an electrical insulating lattice structure situated in an edge region of the component that is essentially hermetically sealed; and an electrically conducting connection formed to at least one of the sensors, the electrically conducting connection being at least partially delimited by an insulating trench which extends to the lattice structure of the third space and includes the third space, wherein metal is situated over the electrically insulating lattice structure.

2. The micromechanical component according to claim 1, further comprising:
   a sealing layer on an upper surface of the component adapted to at least partially seal the an electrical insulating lattice structure and the component.

3. The micromechanical component according to claim 2, wherein the sealing layer is deposited with the aid of different deposition processes.

4. The micromechanical component according to claim 2, further comprising:
   a passivation layer situated on at least a portion of an upper surface of the sealing layer.

5. The micromechanical component according to claim 1, further comprising:
   a connecting region between the one of the two spaces and the third space, the connecting region including a constriction.

6. The micromechanical component according to claim 5, wherein the constriction is formed with the aid of bonding materials of a sensor wafer and a cap wafer of the component.

7. The micromechanical component according to claim 5, wherein the connecting region is a essentially lateral lattice structure and/or a channel structure.

8. The micromechanical component according to claim 1, wherein the third space is formed essentially in a cap wafer or a sensor wafer of the micromechanical component.

9. A method for manufacturing a micromechanical component, comprising:
   providing two spaces in a wafer layer composition;
   forming a third space having a connecting region to one of the two spaces, the third space being guided to an electrical insulating lattice structure in an edge region of the component; and
   sealing the an electrical insulating lattice structure with a sealing layer, a pressure in the one of the two spaces being adjusted as a function of a deposition process of the sealing layer; and
   wherein a formation and a sealing of the third space creates an insulating trench of an electrical via, the insulating trench extends to the an electrical insulating lattice structure of the third space and includes the third space, wherein metal is situated over the electrically insulating lattice structure.

10. The method according to claim 9, wherein the connecting region between the third space and the one of the two spaces includes a constriction.

11. The method according to claim 10, wherein the connecting region is a essentially lateral lattice structure and/or a channel structure.

12. A method of using a micromechanical component comprising a first space in which a first sensor is situated and a second space in which a second sensor is situated, pressures prevailing in each of the first and second spaces being different, wherein one of the two spaces extends via a third space to an electrical insulating lattice structure situated in an edge region of the component that is essentially hermetically sealed, and an electrically conducting connection formed to at least one of the sensors, the electrically conducting connection being at least partially delimited by an insulating trench which extends to the an electrical insulating lattice structure of the third space and includes the third space the method comprising:
   using the component as a yaw rate sensor situated in the first space and an acceleration sensor situated in the second space, wherein metal is situated over the electrically insulating lattice structure.

\* \* \* \* \*